United States Patent [19]

Nishiyama et al.

[11] 4,229,506
[45] Oct. 21, 1980

[54] PIEZOELECTRIC CRYSTALLINE FILM OF ZINC OXIDE AND METHOD FOR MAKING SAME

[75] Inventors: Hiroshi Nishiyama, Mukou; Toshio Ogawa; Tasuku Mashio, both of Nagaokakyo, all of Japan

[73] Assignee: Murata Manufacturing Co., Ltd., Kyoto, Japan

[21] Appl. No.: 942,351

[22] Filed: Sep. 14, 1978

[30] Foreign Application Priority Data

Sep. 17, 1977 [JP] Japan .................. 52/111761

[51] Int. Cl.³ .................. H01L 41/18; C23C 15/00; B32B 9/00
[52] U.S. Cl. .................. 428/539; 204/192 R; 204/298; 252/62.9; 310/313 A; 357/10; 357/60; 428/913
[58] Field of Search .................. 252/62.9 R, 62.9 PZ; 310/313; 204/298, 192 R; 428/539, 538, 913; 357/4, 10, 60, 61

[56] References Cited

U.S. PATENT DOCUMENTS

| | | | |
|---|---|---|---|
| 3,006,857 | 10/1961 | Kulcsar | 252/62.9 |
| 3,420,763 | 1/1969 | Polito et al. | 357/4 |
| 3,663,899 | 5/1972 | Dieulesaint et al. | 310/313 X |
| 3,671,193 | 6/1972 | Jaskolski et al. | 252/62.9 X |
| 3,682,826 | 8/1972 | Ichinose et al. | 252/62.9 |
| 3,684,715 | 8/1972 | Ichinose et al. | 252/62.9 |
| 3,688,223 | 8/1972 | Pratt et al. | 310/313 X |
| 3,766,041 | 10/1973 | Wasa et al. | 252/62.9 X |
| 3,856,693 | 12/1974 | Kim | 252/62.9 |
| 4,019,074 | 4/1977 | Shibayama et al. | 310/313 |
| 4,139,678 | 2/1979 | Ogawa et al. | 428/539 X |
| 4,142,124 | 2/1979 | Ogawa et al. | 252/62.9 X |
| 4,151,324 | 4/1979 | Ogawa et al. | 252/62.9 X |
| 4,156,050 | 5/1979 | Ogawa et al. | 252/62.9 X |
| 4,164,676 | 8/1979 | Nishiyama et al. | 252/62.9 X |
| 4,174,421 | 11/1979 | Nishiyama et al. | 428/539 X |

*Primary Examiner*—Harold Ansher
*Attorney, Agent, or Firm*—Birch, Stewart, Kolasch & Birch

[57] ABSTRACT

Piezoelectric crystalline film on a substrate, which is a crystalline zinc oxide film with a hexagonal crystal structure and a c-axis substantially perpendicular to the substrate surface, the crystalline zinc oxide film containing, as an additive element, uranium. The piezoelectric crystalline films have high resistivity and a smooth surface, and make it possible to produce piezoelectric transducers with good conversion efficiency. Such films are made by sputtering zinc oxide and uranium onto a substrate from a film material source consisting essentially of a ceramic of zinc oxide containing uranium.

7 Claims, 1 Drawing Figure

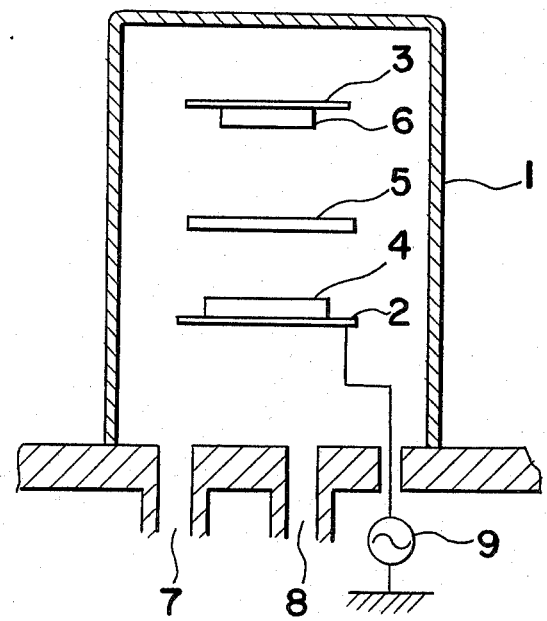

PIEZOELECTRIC CRYSTALLINE FILM OF ZINC OXIDE AND METHOD FOR MAKING SAME

BACKGROUND AND SUMMARY OF THE INVENTION

The present invention relates to piezoelectric crystalline films. More particularly, it relates to piezoelectric crystalline films comprising zinc oxide having a hexagonal crystal structure, and a method for making the same.

There are many methods for making piezoelectric crystalline zinc oxide films such as, for example, vacuum deposition methods, epitaxial growth methods, sputtering methods, and ion plating methods. Among these methods, the sputtering methods, particularly, radio-frequency sputtering method has been used very often recently because it has the advantage that the high growth rate of the oriented crystalline films is possible, thus making it possible to mass-produce piezoelectric crystalline films, industrially.

When making a piezoelectric crystalline film of zinc oxide on a substrate surface by the radio-frequency sputtering method, a ceramic of highly pure zinc oxide has been conventionally used as a source of the film material. However, even when radio-frequency sputtering is effected with such a film material source, it results in the formation of a crystalline film which is poor in adhesion to a substrate and low in quality. In addition, it is difficult with such a film material source to make a piezoelectric crystalline film with a c-axis perpendicular to the substrate surface. If a piezoelectric crystalline film of zinc oxide has poor adhesion, various disadvantages occur. For example, when manufacturing an acoustic surface wave filter with such a zinc oxide film, it is difficult to form interdigital transducers on the film surface, and the produced acoustic surface wave filter tends to have the disconnection of interdigital transducers, and to possess a large propagation loss of acoustic surface waves. Also, if the c-axis of the zinc oxide film is inclined with respect to the axis perpendicular to the substrate surface, the electromechanical coupling factor is lowered, thus making it difficult to produce a piezoelectric crystalline film transducer with good conversion efficiency.

It has now been found that the incorporation of uranium into a zinc oxide film makes it possible to produce a piezoelectric crystalline film with a c-axis perpendicular to the substrate surface and with high quality.

It is an object of the present invention to provide an improved zinc oxide piezoelectric crystalline film which overcomes the aforesaid disadvantages.

Another object of the present invention is to provide a method for making such improved piezoelectric crystalline films.

According to the present invention, there is provided a piezoelectric crystalline film on a substrate, the film being a crystalline zinc oxide film with a hexagonal crystal structure and a c-axis substantially perpendicular to the substrate surface, characterized in that said zinc oxide film contains uranium.

Since the content of uranium has great influence on the electrical and physical properties of the films, it is preferred to limit its content to the range of from 0.01 to 20.0 atomic percent when converted into the percentage of uranium atoms. Because, if the content of uranium is less than 0.01 atomic percent, the film changes for the worse in the quality and adhesion, and if the content of uranium is more than 20.0 atomic percent, the direction of the crystallographic orientation of the film can not be well controlled, resulting in the worsening of the orientaion of the piezoelectric crystalline film.

As a material for the substrate on which the piezoelectric crystalline film is formed, there may be used those substances such as, for example, metal, glass, ceramics, single crystals, resin, rubber and the like.

The piezoelectric crystalline film of the present invention has a c-axis substantially perpendicular to the substrate surface, thus making it possible to produce piezoelectric transducers with good conversion efficiency. Further, the piezoelectric crystalline films of the present invention have high resistivity and good adhesion, and a smooth surface.

The piezoelectric crystalline film of the present invention may be made by any sputtering method such as the radio-frequency sputtering method, and the co-sputtering method. A preferred method for making piezoelectric crystalline films according to the present invention comprises sputtering zinc oxide and uranium onto a surface of a substrate to form a crystalline zinc oxide film with a hexagonal crystal structure and a c-axis substantially perpendicular to the substrate surface, and is characterized in that said sputtering is effected by using a film material source consisting essentially of a ceramic of zinc oxide containing 0.01 to 20.0 atomic percent of uranium.

These and other objects, features and advantages of the present invention will be further apparent from the following description with respect to the examples and the accompanying drawing which shows a diagrammatic view of a known radio-frequency sputtering apparatus used for making piezoelectric crystalline films of the present invention.

Referring now to the drawing, there is shown a radio-frequency sputtering apparatus with two electrodes which is used for making piezoelectric crystalline films of the present invention. The apparatus comprises a bell jar 1 in which a pair of electrodes, i.e., a planar cathode 2 and a planar anode 3 are positioned in parallel. Fixed on the cathode 2 is a film material source 4 consisting essentially of a ceramic of zinc oxide containing uranium. A shutter 5 is positioned between electrodes 2 and 3. A substrate 6 consisting of, for example, glass or metal is fixed to the bottom of the anode 3 so as to sit opposite to the film material source. The substrate 6 is heated to a temperature in the range from 20° C. to 600° C. during sputtering. A vent 7 and a gas inlet 8 are provided in the bell jar 1.

The radio-frequency sputtering is effected in the following manner: After making it airtight, the bell jar 1 is evacuated through the vent 7 to a vacuum of more than $1 \times 10^{-6}$ Torr, and then supplied with argon or oxygen gas or a mixed gas of argon and oxygen through the gas inlet 8, thereby adjusting the pressure in the bell jar 1 to from $1 \times 10^{-1}$ to $1 \times 10^{-4}$ Torr. A radio-frequency voltage is applied between the cathode 2 and the bell jar 1 by a radio-frequency electric power source 9. Electric power of 2 to 8 W/cm² is supplied to the film material source 4.

The film material source consisting essentially of a ceramic of zinc oxide containing uranium is prepared in the following manner:

Using a powder of ZnO, and $U_3O_8$ as raw materials, there are prepared mixtures to produce ceramics of zinc oxide each having a compositional proportion as shown in Table 1. Each of the mixtures is milled by the wet process, dried and then calcined at 600° to 800° C. for 2 hours. The presintered body is crushed, milled by the wet process with an organic binder and then dried. The resultant powder is shaped into discs with a diameter of 100 mm and a thickness of 5 mm at a pressure of 1000 kg/cm$^2$ and then fired at 1200° C. for 2 hours to obtain film material sources.

The thus obtained film material sources were subjected to measurements of the percentage of bulk density $d_s$ to theoretical density $d_t$ ($d_s/d_t \times 100$). The results are shown in Table 1.

TABLE 1

| Specimen No. | Additive (atomic %) uranium | Film material source Resistivity ($\Omega \cdot cm$) | ($d_s/d_t$) × 100(%) | Piezoelectric crystalline film of zinc oxide ||||| 
|---|---|---|---|---|---|---|---|---|
| | | | | Orientation $\overline{X}$ | $\delta$ | Resistivity ($\Omega \cdot cm$) | Quality | Adhesion |
| 1 | — | 8.6 × 10 | 85.0 | 5.8 | 5.5 | 3.5 × 10$^3$ | rough | bad |
| 2 | 0.005 | 4.8 × 10$^2$ | 86.0 | 5.2 | 4.4 | 8.0 × 10$^6$ | " | " |
| 3 | 0.05 | 3.3 × 10$^5$ | 90.0 | 0.5 | 2.1 | 3.4 × 10$^7$ | smooth | good |
| 4 | 0.1 | 2.2 × 10$^5$ | 94.0 | 1.4 | 3.0 | 2.8 × 10$^8$ | " | " |
| 5 | 5.0 | 1.8 × 10$^4$ | 92.0 | 4.2 | 3.5 | 4.7 × 10$^{10}$ | " | " |
| 6 | 15.0 | 1.0 × 10$^4$ | 93.0 | 5.7 | 3.7 | 6.3 × 10$^{11}$ | " | " |
| 7 | 25.0 | 7.5 × 10$^3$ | 90.0 | — | — | — | — | — |

Using the respective film material sources, piezoelectric crystalline zinc oxide films containing uranium are made on glass substrates with the aforesaid radio-frequency sputtering apparatus. The radio-frequency sputtering is carried out under the following conditions: A mixed gas of 90 vol% of argon and 10 vol% of oxygen is supplied to the bell jar 1 through the gas inlet 8, thereby adjusting the pressure in the bell jar 1 to $2 \times 10^{-3}$ Torr. The glass substrate is heated to and maintained at 350° C. The film material source 4 is supplied with 6 W/cm$^2$ of electric power with a frequency of 13.56 MHz.

The c-axis orientation of the thus obtained piezoelectric crystalline films was measured with a locking curve method by X-ray diffraction (Ref.: Minakata, Chubachi and Kikuchi "Quantitative Representation of c-axis Orientation of Zinc Oxide Piezoelectric Thin Films" The 20th Lecture of Applied Physics Federation (Japan). vol. 2 (1973) page 84; and Makoto Minakata, The Tohoku University Doctor's Thesis (1964)). The mean value ($\overline{X}$) and standard deviation ($\delta$) of the angle of the c-axis with respect to the axis perpendicular to the substrate surface were obtained from respective specimens. The results of the measurement of the resistivity, film quality and adhesion of the film to the substrate are also shown in Table 1. The experiment to determine whether the film has sufficient adhesive force was carried out by the thermal shock test method 107C of MILSTD-202D. A film which peeled off from the surface of the substrate was judged as "bad", a film in which cracks were produced was judged as "passable", and a film which showed no change was judged as "good".

As is evident from Table 1, the crystalline films of the present invention have a c-axis substantially perpendiculer to the substrate surface, from which it will be understood that the piezoelectric crystalline films of the present invention have a large electromechanical coupling factor, i.e., good conversion efficiency. Further, the piezoelectric crystalline films of the present invention are smooth, and have good adhesion to the substrate and very high resistivity.

In the above examples, triuranium octoxide is used as a source of uranium for making ceramics of zinc oxide containing uranium, but any other oxide or compound of uranium may be employed as a source material.

The use of a film material source containing uranium has its own advantages, as follows.

When mass-producing piezoelectric crystalline films industrially by the radio-frequency sputtering method, it is necessary to increase the crystal growth rate as much as possible. To do this, the electric power supplied to the film material source per unit area thereof is increased with the result that the film material source is required to have a high bulk density. This requirement is fully satisfied by the sources containing uranium. As is evident from Table 1, these film material sources have a bulk density higher than that of the conventionally used sources. Thus, the film material sources containing uranium make it possible to mass-produce zinc oxide piezoelectric crystalline films by the use of high electric powers.

What we claim is:

1. A piezoelectric crystalline film disposed on a substrate, said film being a crystalline zinc oxide film with a hexagonal crystal structure and a c-axis substantially perpendicular to the substrate surface, characterized in that said crystalline zinc oxide film contains 0.01 to 20.0 atomic percent of uranium.

2. The piezoelectric crystalline film of claim 1 wherein said substrate is made of glass.

3. The piezoelectric crystalline film of claim 1 wherein said substrate is made of a metal.

4. The piezoelectric crystalline film of claim 1, wherein said substrate is made of a ceramic.

5. The piezoelectric crystalline film of claim 1, wherein said substrate is made of a single crystal.

6. The piezoelectric crystalline film of claim 1, wherein said substrate is made of a resin.

7. The piezoelectric crystalline film of claim 1, wherein said substrate is made of rubber.

* * * * *